(12) United States Patent  
Fujisawa et al.

(10) Patent No.: US 8,212,224 B2  
(45) Date of Patent: Jul. 3, 2012

(54) CHARGED PARTICLE BEAM DEVICE

(75) Inventors: Akiko Fujisawa, Hitachinaka (JP); Hiroyuki Kobayashi, Mito (JP); Eiko Nakazawa, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 338 days.

(21) Appl. No.: 12/389,838

(22) Filed: Feb. 20, 2009

(65) Prior Publication Data

US 2009/0218507 A1 Sep. 3, 2009

(30) Foreign Application Priority Data

Feb. 29, 2008 (JP) ................................. 2008-049002

(51) Int. Cl.
*G21K 5/10* (2006.01)
*H01J 37/26* (2006.01)

(52) U.S. Cl. .............. 250/397; 250/396 R; 250/306; 250/307

(58) Field of Classification Search .......... 250/306, 250/307, 309, 310, 311, 396 R, 397, 492.1, 250/492.3
See application file for complete search history.

(56) References Cited

U.S. PATENT DOCUMENTS

| 5,623,148 A * | 4/1997 | Wenzel et al. ............ 250/427 |
| 2007/0164226 A1 * | 7/2007 | Hamashima et al. ...... 250/385.1 |

FOREIGN PATENT DOCUMENTS

| JP | 46-9872 | 4/1971 |
| JP | 48-5947 | 2/1973 |
| JP | 08-212951 | 8/1996 |
| JP | 08-339773 | 12/1996 |
| JP | 2002-008572 | 1/2002 |
| JP | 2004-134300 | 4/2004 |
| WO | WO 2004/027814 A2 | 4/2004 |

OTHER PUBLICATIONS

European Search Report issued in European Patent Application No. 09002591.7-2208/2096662, dated Jun. 16, 2010.
R.E. Ogilvie, "Electron accelerators for high voltage electron microscopes," vol. 1, No. 3, Dec. 1969, pp. 257-262.
Japanese Office Action, with English translation, issued in Japanese Patent Application No. 2008-049002, mailed Jun. 22, 2010.

* cited by examiner

*Primary Examiner* — David A Vanore
*Assistant Examiner* — Nicole Ippolito
(74) *Attorney, Agent, or Firm* — McDermott Will & Emery LLP

(57) ABSTRACT

The present invention provides a charged particle beam device which can effectively restrain misalignment of an optical axis even if a position of an anode is changed. The present invention is a charged particle beam device comprising a cathode provided with a charged particle source which emits a charged particle, an anode which applies an electric field to the emitted charged particle, a charged particle beam deflector which deflects an orbit of a charged particle beam having passed the anode, and a charged particle beam detector which detects the charged particle beam from a sample to which the charged particle is irradiated, wherein a distance changing mechanism which changes a distance between the cathode and the anode, corresponding to a charged particle amount emitted from the charged particle source and a deflection amount control mechanism which detects a condition of the deflector under which the charged particle dose detected from the sample scanned by deflecting the charged particle beam in the changed distance becomes a desired size and controls deflection of the deflector at sample measurement on the basis of the condition are provided.

7 Claims, 6 Drawing Sheets

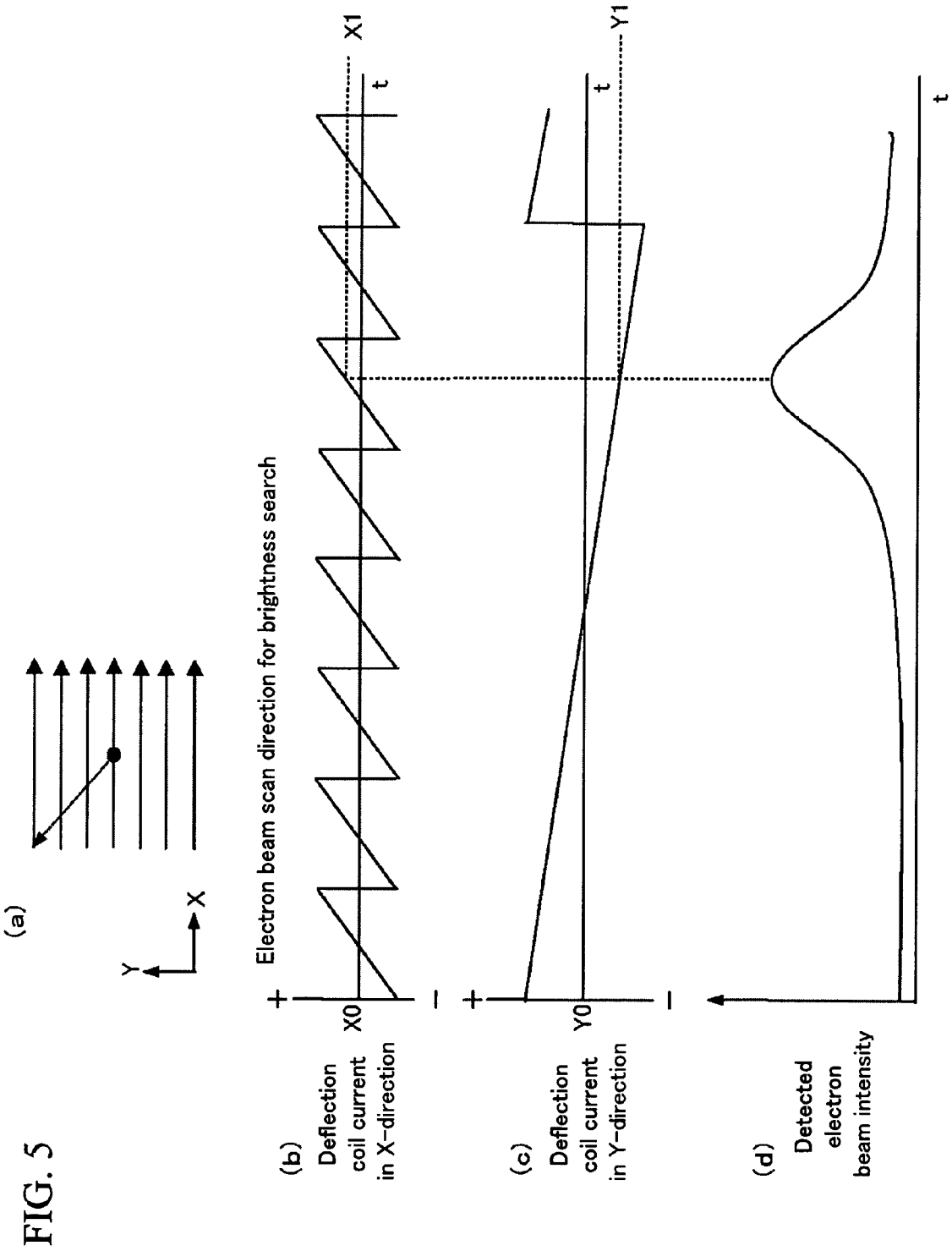

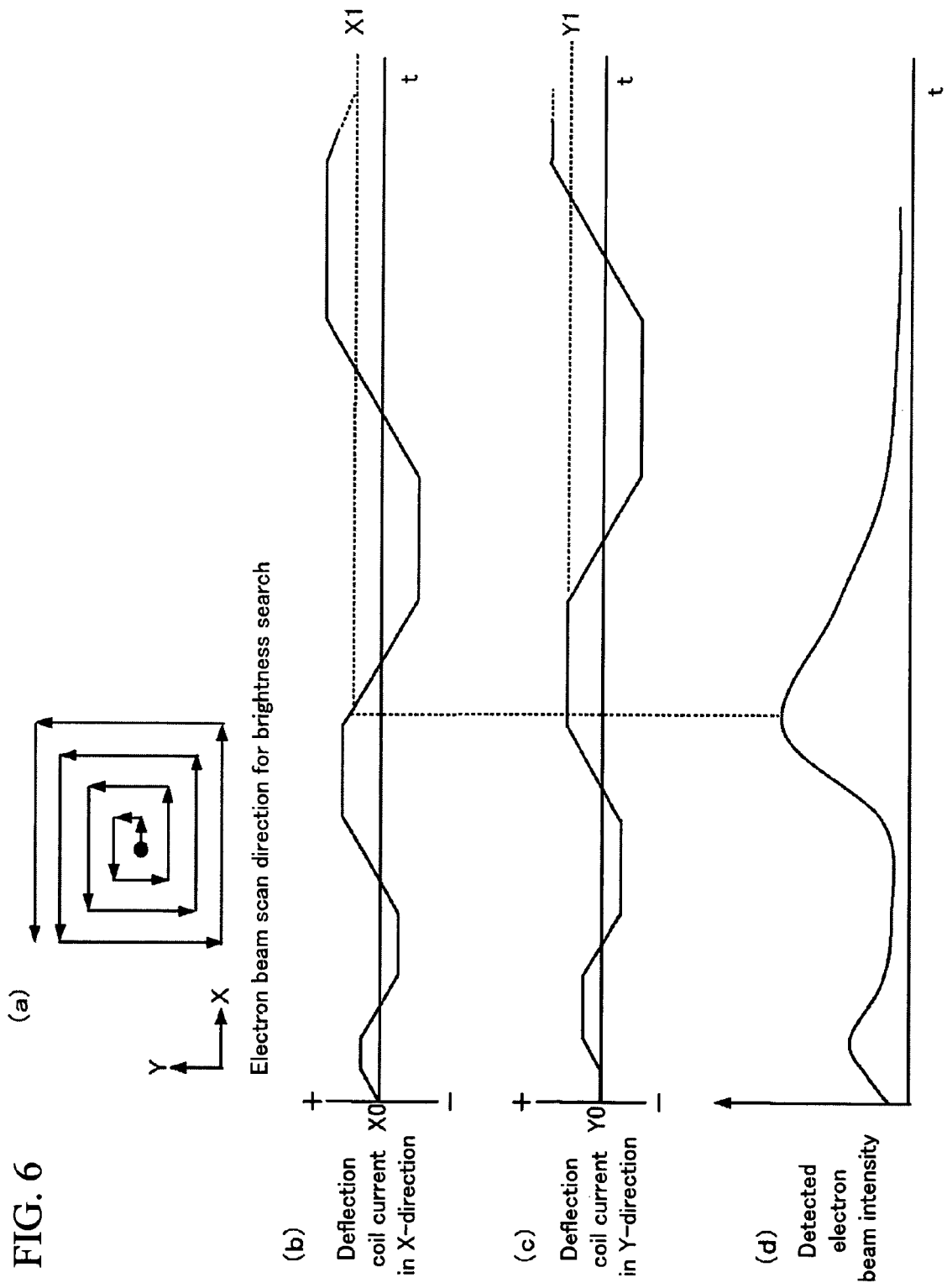

CHARGED PARTICLE BEAM DEVICE

BACKGROUND OF THE INVENTION

1. Field of the Invention

The present invention relates to a charged particle beam device.

2. Background Art

Usually, in a charged particle source peripheral mechanism of a charged particle beam device such as an electron gun of an electronic microscope, a distance between a cathode (negative electrode) and an anode (positive electrode) is fixed. Thus, if a low-acceleration voltage is applied in use, an electric field intensity lacks, and a sufficient electron dose can not be drawn out of the cathode. In order to improve this, as a mechanism that can vary a position of the anode, there is a related art (JP Utility Model Registration No. 1016333 (JP Utility Model Publication (Kokoku) No. 48-5947 Y (1973))) configured such that the above distance is shorten when a low-acceleration voltage is applied and a sufficient electron dose can be drawn out of the cathode by increasing the electric field intensity. Also, in JP Patent Publication (Kokai) No. 2002-8572 A, a section which can move a position of a perforated positive electrode (anode) forward and backward in an X-ray tube with respect to the negative electrode (cathode) is provided.

Patent Document 1: JP Utility Model Publication (Kokoku) No. 48-5947 Y (1973)

Patent Document 2: JP Patent Publication (Kokai) No. 2002-8572 A

SUMMARY OF THE INVENTION

However, in the above known example of JP Utility Model Publication (Kokoku) No. 48-5947 Y (1973), there is no description from the viewpoint of optical axis adjustment of the electronic microscope, and also in JP Patent Publication (Kokai) No. 2002-8572 A, though a deflection coil is shown, the description remains at a level of the deflection coil which adjusts a direction of an electron beam, and there is no detailed explanation. That is, there is no consideration in the above known examples from the viewpoint of the optical axis adjustment involved in a positional change of the anode. In the electronic microscope, an optical axis of an electron beam generation portion (electron gun) is not matched with the optical axis with an irradiation lens system located on a rear stage due to the positional change of the anode, which causes a slight misalignment and affects observation of an enlarged image during operation. A cause of the slight misalignment is presumed to be various misalignments in a mechanism such as non-ideal location on the optical axis of positions of an electron beam passage hole of the anode, an electron beam passage hole of Wehnelt, and a filament distal end from which the electron is emitted, mismatch of parallelism between opposed faces of the anode and the Wehnelt, an angle of the filament distal end to the optical axis and the like, and the optical axis of the electron gun is estimated to be changed with the positional change of the anode.

The present invention is to provide a charged particle beam device that can restrain the above problems and can effectively restrain the misalignment of the optical axis even if the position of the anode is changed.

An aspect of the present invention is a charged particle beam device provided with a cathode provided with a charged particle source that emits a charged particle, an anode which applies an electric field to the emitted charged particle, a charged particle beam deflector which deflects an orbit of a charged particle beam having passed the anode, and a charged particle beam detector which detects the charged particle beam from a sample to which the charged particle is irradiated, wherein a distance changing mechanism which changes a distance between the cathode and the anode, corresponding to a charged particle amount emitted from the charged particle source and a deflection amount control mechanism which detects a condition of the deflector under which the charged particle beam amount detected from the scanned sample by deflecting the charged particle beam in the changed distance becomes a desired size and controls deflection of the deflector at sample measurement on the basis of the condition are provided.

In a search for detecting the electron dose to become the desired size, an output portion which stores and calls up lens data of at least one pair or more of electronic optical systems for search and outputs it may be provided.

Also, in the above device, the distance changing mechanism is provided with an anode-position changing mechanism which changes an anode position, and a memory portion which stores the condition data of the charged particle beam deflector corresponding to the anode position, a read-out portion which calls up the stored data from the memory portion, and an output portion which outputs the called-up data to the charged particle beam deflector, and the deflection amount control mechanism changes the output of the electron beam deflector on the basis of the called-up data, detects the condition, and stores the detected condition in the memory portion.

Specifically, an input portion which sets a voltage to be applied to the cathode, for example, may be provided so that the anode position can be changed corresponding to the size of the set voltage.

Also, for example, a Wehnelt provided between the charged particle source and the anode and an input portion which sets the charged particle beam amount emitted from the charged particle beam source may be provided so that the anode position and the voltage to be applied to the Wehnelt, the voltage to be applied to the charged particle beam source or the both voltages can be controlled corresponding to the set charged particle beam amount.

Also, for example, a detection portion that detects a charged particle beam amount emitted from the charged particle beam source may be provided and configured so that the anode position is changed according to the detected charged particle beam amount and the emitted electron dose is controlled.

Also, specifically, for example, it is a charged particle beam device provided with a cathode provided with an electron source which emits electron, an anode which applies an electric field to the emitted electron, an electron beam deflector which deflects an orbit of the electron beam having passed the anode, and an electron beam detector which detects the electron beam from a sample to which the electron is irradiated, wherein a distance changing mechanism which changes a distance between the cathode and the anode, corresponding to a change of a set voltage to be applied to the cathode and a deflection amount control mechanism which detects a deflection amount at which an electron dose detected from the sample scanned by deflecting the electron beam in the changed distance becomes a desired size and stores a correction amount of axial misalignment of the electron beam on the basis of the deflection amount are provided so that the sample is measured on the basis of the correction amount.

According to the present invention, even if the anode position is changed, optical axis adjustment can be made automatically, which saves labor and time spent for the optical axis adjustment, and a cumbersome adjustment work can be restrained. Also, even at a low-acceleration voltage, observation can be made with a sufficient electron dose (brightness) required for image observation.

BRIEF DESCRIPTION OF THE DRAWINGS

FIG. 5 is a diagram for explaining a first example for searching an electron beam change amount that an electron dose becomes the maximum by scanning the electron beam in the transmission electronic microscope of this embodiment.

FIG. 6 is a diagram for explaining a second example for searching an electron beam change amount that an electron dose becomes the maximum by scanning the electron beam in the transmission electronic microscope of this embodiment.

Figure 1:
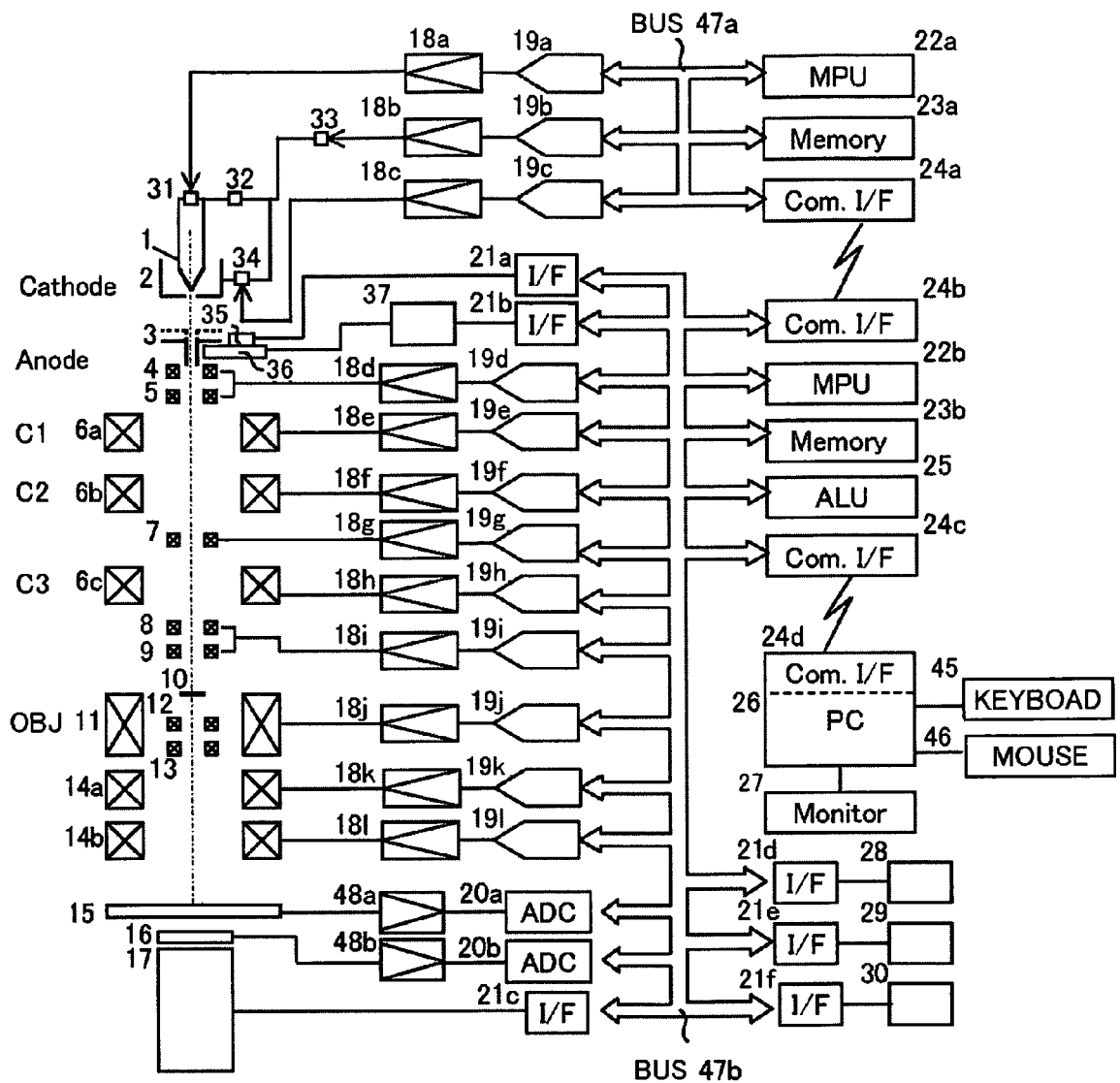
FIG. 1 is a diagram illustrating an example of a structure of an electronic microscope of an embodiment of the present invention.

DESCRIPTION OF SYMBOLS 1 filament
2 Wehnelt
3 anode
4, 5 deflection coil for electron gun axis adjustment
6a to 6c irradiation lens coil
7 coil for astigmatism correction of irradiation system lens
8, 9 deflection coil for irradiation system axis adjustment
10 sample
11 objective lens coil
12 coil for objective lens astigmatism correction
13 deflection coil for image shift
14a, 14b image forming lens coil
15 fluorescent plate
16 photoelectric conversion element for image pickup
17 CCD camera
18a to 18n power source
19a to 19l DAC
20a, 20b ADC
21a to 21f interface
22a, 22b microprocessor
23a, 23b storage device
24a to 24d communication interface
25 calculating device
26 PC
27 monitor
28 input section which moves anode (input portion for anode movement)
29 input section which deflects electron beam (input portion for electron beam deflection)
30 electron dose input section (electron dose input portion)
31 filament power source
32 resistor for bias
33 high-voltage generating power source
34 bias power source
35 sensor
36 anode movable mechanism
37 movable mechanism power source
38 anode support base
39 linear actuator
40 worm gear
41 motor
42 rotary encoder
43 air cylinder
44a, 44b pipe
45 keyboard
46 mouse
47a, 47b bus
48a, 48b amplifier

DETAILED DESCRIPTION OF THE PREFERRED EMBODIMENTS

The present invention is not limited to the mode described in the description but allows improvements and changes of the invention. This embodiment will be described using an electronic microscope as an example, but the present invention may be applied to other devices such as an ion beam device, for example.

Specifically, there are provided a cathode provided with an electron source which emits an electron, an anode which applies an electric field to the emitted electron, an electron beam deflector which deflects an orbit of the electron beam having passed the anode, and an electron beam detector which detects the electron beam from a sample to which the electron is irradiated, and a distance changing mechanism which changes a distance between the cathode and the anode, corresponding to a change in a set voltage to be applied to the cathode and a deflection amount control mechanism which detects a deflection amount at which the electron dose detected from the sample scanned by deflecting the electron beam in the changed distance becomes a desired size and stores a correction amount of axis misalignment of the electron beam on the basis of the deflection amount are provided so that the sample is measured on the basis of the correction amount, for example.

As a more preferable specific mode, it is preferable that two types of misalignment: optical axis misalignment depending on a moving anode position and mechanistic optical axis misalignment caused accidentally by movement of the anode are handled. In the former case, since the misalignment depends on the moving anode position, by providing a section which stores an output value of the electron beam deflector (storage portion) at each position so as to store a value (data) of the electron beam deflector adjusted for the position in advance, detecting the position and calling up and outputting the data corresponding to that, the optical axis misalignment does not occur. Alternatively, it may be so configured that an optical axis misalignment amount with respect to the anode position is measured, a relational expression is derived, and the value is outputted to the electron beam deflector at each anode positional change on the basis of the expression. In the latter case, since it is accidental optical axis misalignment and has no reproducibility, an optimal electron beam deflection amount needs to be set each time the anode position is moved. In such a case, a section which detects the electron beam (detection portion) and a section which scans the electron beam (scanning portion) are provided, an electron beam deflection amount at which the electron dose detected by the scanning portion becomes the maximum is derived in conjunction with the anode positional change, and control is made so that the deflection amount is outputted to the electron beam deflector.

An electronic microscope according to the present invention will be described in detail below referring to FIG. 1. The electronic microscope of the present invention includes a transmission electronic microscope and a scanning transmission electronic microscope. The transmission electronic microscope will be described below as an example of the present invention, but the present invention can be also applied to the scanning electronic microscope.

An electron beam emitted and accelerated from an electron gun portion constituted by a cathode portion provided with a filament 1 as a source of charged particle such as an electron and a filament power source 31 which applies a filament voltage, a resistor 32 for bias and a bias power source 34 which applies a bias voltage, a high-voltage generating power source 33, and a Wehnelt 2 which applies a negative voltage to the filament, and an anode 3 set at a ground potential for accelerating the electron emitted through an electron passage hole of the Wehnelt by controlling an electron dose emitted by a potential of the Wehnelt is converged by irradiation lens coils 6a to 6c and irradiated on a face of a sample 10. Here, a microprocessor 22a controls the filament power source 31, the resistor 32 for bias, the bias power source 34, and power sources 18a, 18b, 18c of the high-voltage generating power source 33 by DACs (digital-analog converter) 19a, 19b, 19c through a bus 47a. As a distance changing mechanism between the electron source and the anode 3, for example, a mechanism for changing a position of the anode 3, which will be described later, can be used. Also, the anode 3 can make its position varied by an anode movable mechanism 36, and the anode position is detected by a sensor 35. The anode movable mechanism 36 is driven by power supplied from a movable mechanism power source 37, and the anode movable mechanism 36 and the sensor 35 are controlled by a microprocessor 22b through interfaces 21a, 21b.

The electron beam transmitted through the sample 10 is enlarged by an objective lens coil 11 and image forming lens coils 14a, 14b and forms an image at a fluorescent plate 15 or a photoelectric conversion element for image pickup (scintillator) 16. A transmission enlarged image of the sample converted to an optical image by the photoelectric conversion element 16 for image pickup is picked up by an image pickup device such as a CCD camera 17, for example. A signal from the CCD camera 17 is taken into the microprocessor 22b through an image taking-in interface 21c and processed and then, displayed as an image on a monitor 27 controlled by a PC 26. Here, when the transmission enlarged image is taken into the microprocessor 22b, the photoelectric conversion element 16 for image pickup and the CCD camera 17 are used, but a detection element that can directly convert the electron beam to an electric signal may be used. Also, the electron dose incident to the fluorescent plate 15 and the photoelectric conversion element 16 for image pickup is detected by the microprocessor 22b through ADCs (analog-digital converter) 20a, 20b.

The microprocessor 22b controls the irradiation lens coils 6a to 6c of the electronic microscope, the objective lens coil 11, and power sources 18e, 18f, 18h, 18j, 18k, 18l supplying power to the image forming lens coils 14a, 14b through DACs 19e, 19f, 19h, 19j, 19k, 19l. An electron beam deflector is located between the filament and a sample installed portion, and the deflector is installed at least one spot or more. The electron beam deflector is provided with at least one or more of a function to horizontally move the electron beam with respect to the optical axis, a function to incline it, and a function to correct aberration. Specifically, power sources 18d, 18g, 18i for deflection coils for electron gun axis adjustment (electron beam horizontal movement and inclination functions) 4, 5 above the sample, a coil 7 for irradiation system lens astigmatism correction, and coils for irradiation system axis adjustment (electron beam horizontal movement and inclination functions) 8, 9 are similarly controlled by the microprocessor 22b through DACs 19d, 19g, 19i. Also, to the microprocessor 22b, a storage device 23b, a calculating device 25, input section 28 which moves anode, input section 29 for electron beam deflection, electron dose input section 30 and the like are connected through a bus 47b. The PC 26 and the monitor 27 are connected to the bus 47b through communication interfaces 24c, 24d, and a keyboard 45 and a mouse 46 connected to the PC 26 can be also used as input sections such as the input section 28 which moves anode, the input section 29 for electron beam deflection, and the electron dose input section 30. In FIG. 1, an MPU for control is configured in plural, but it may be constituted by a single MPU controlling them all in an integrated manner.

Figure 2:
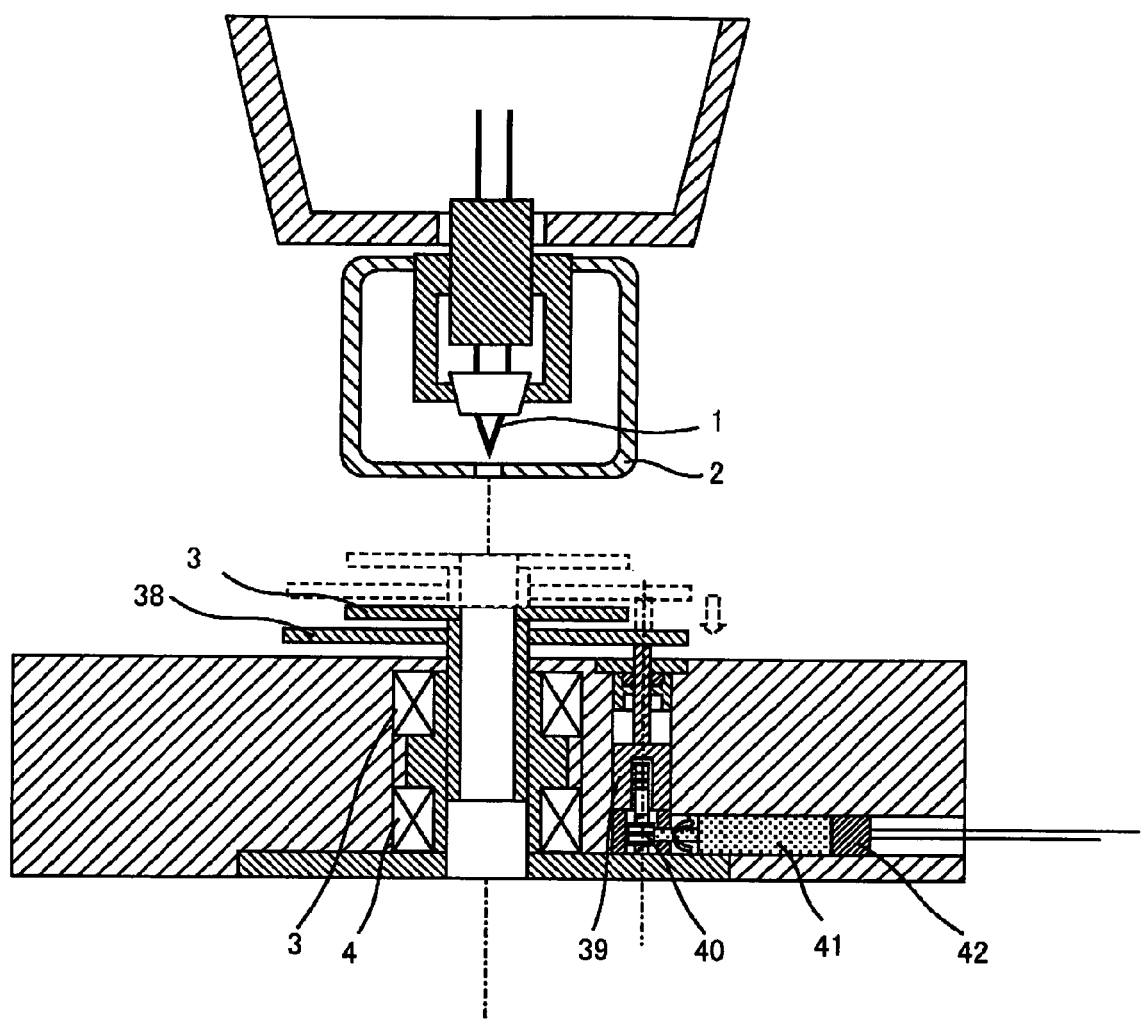
FIG. 2 is a schematic diagram for explaining a first example of an anode movable mechanism in a transmission electronic microscope of this embodiment.

Subsequently, an example of the anode movable mechanism in the present invention will be described using FIGS. 2 and 3. FIG. 2 shows the motor-driven anode movable mechanism. To the anode 3, an anode support base 38 is attached. An anode moving amount is inputted using a rotary encoder 42. A pulse wave generated at the rotary encoder 42 is converted to a digital signal at the interface 21a. The microprocessor 22b outputs an anode position set in advance in the storage device 23b for each acceleration voltage on the basis of the digital signal inputted from the interface 21a and drives a motor 41 so that the applicable anode position is reached, by which a worm gear 40 is rotated in conjunction with rotation of the motor 41. A linear actuator 39 which converts the rotary motion of the worm gear 40 to a linear motion is driven, and the linear actuator 39 vertically moves the anode support base 38 so as to vary the position of the anode 3.

Figure 3:
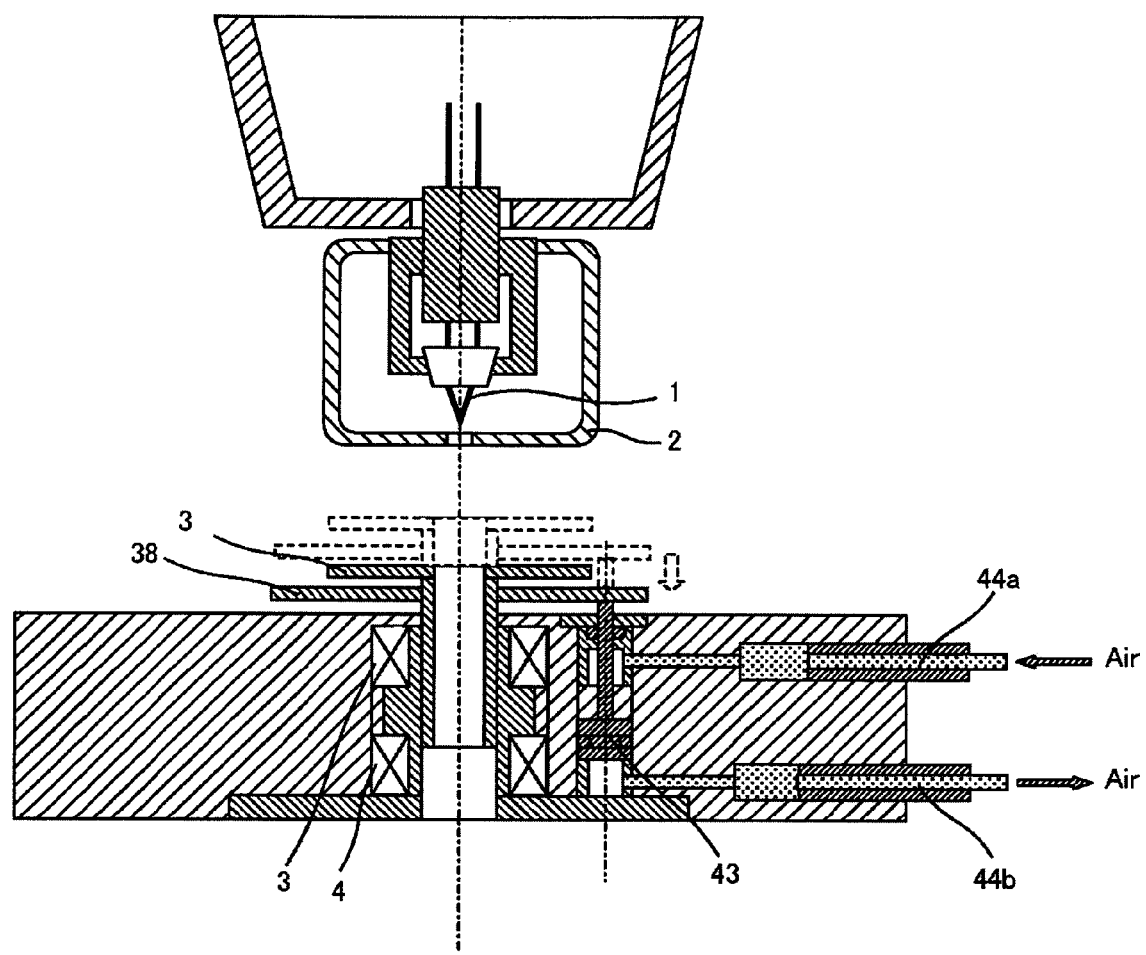
FIG. 3 is a schematic diagram for explaining a second example of an anode movable mechanism in the transmission electronic microscope of this embodiment.

FIG. 3 shows the air-driven anode movable mechanism. To the anode 3, the anode support base 38 is attached. The anode support base 38 is attached to an air cylinder 43, and when air is fed into a pipe 44a and air is drained from a pipe 44b, the anode support base is moved downward, while when the air is drained from the pipe 44a and air is fed from the pipe 44b, the anode support base is moved upward. By moving the anode support base 38 vertically, the position of the anode 3 is varied.

An embodiment of the present invention will be described below specifically.

As a mode which embodies the present invention, for example, a filament to which a negative voltage is applied so as to emit thermal electron by electrifying and heating, a Wehnelt for applying the negative voltage to the filament and an electron beam of the Wehnelt, an anode at a ground potential for accelerating the electron beam emitted through a passage hole, and a mechanism that can move a position of the anode are provided, a section which moves the anode position by a moving amount set in advance, a section which detects an electron dose emitted from the filament, an electron beam deflector which corrects an orbit change of the electron beam emitted by a positional change of the anode, and a section which scans the electron beam superimposed with or independently from the deflector are provided, and it may be configured such that by searching the electron beam deflection amount at which the electron dose detected at each movement of the anode set in advance becomes the maximum, the anode movement and the electron beam deflection are repeatedly controlled so that the detected electron dose becomes the maximum all the time till a predetermined anode position is reached.

Also, in the transmission electronic microscope with the configuration shown in FIG. 1, the anode position is varied by the moving amount set in advance according to the acceleration voltage, the electron beam is scanned by the electron beam deflector, the electron beam deflection amount at which the electron dose becomes the maximum is searched, and an optical condition is set. Here, the method of repeatedly carrying out the control of the anode position and the electron beam deflection so that the detected electron dose becomes the maximum all the time till the predetermined anode position is reached will be described using a flowchart in FIG. 4.

For example, the anode position may be varied so as to have a region so that a distance to the electron source or the cathode position becomes longer when the acceleration voltage is higher rather than lower.

Here, a relation between the acceleration voltage and the anode position is described, but the distance between the anode and the cathode may be made variable on the basis of the condition set in advance. For example, an index corresponding to the electric field affecting the filament as the electron source or the electron dose emitted from the filament can be used. The index may be an index used in general.

Figure 4:
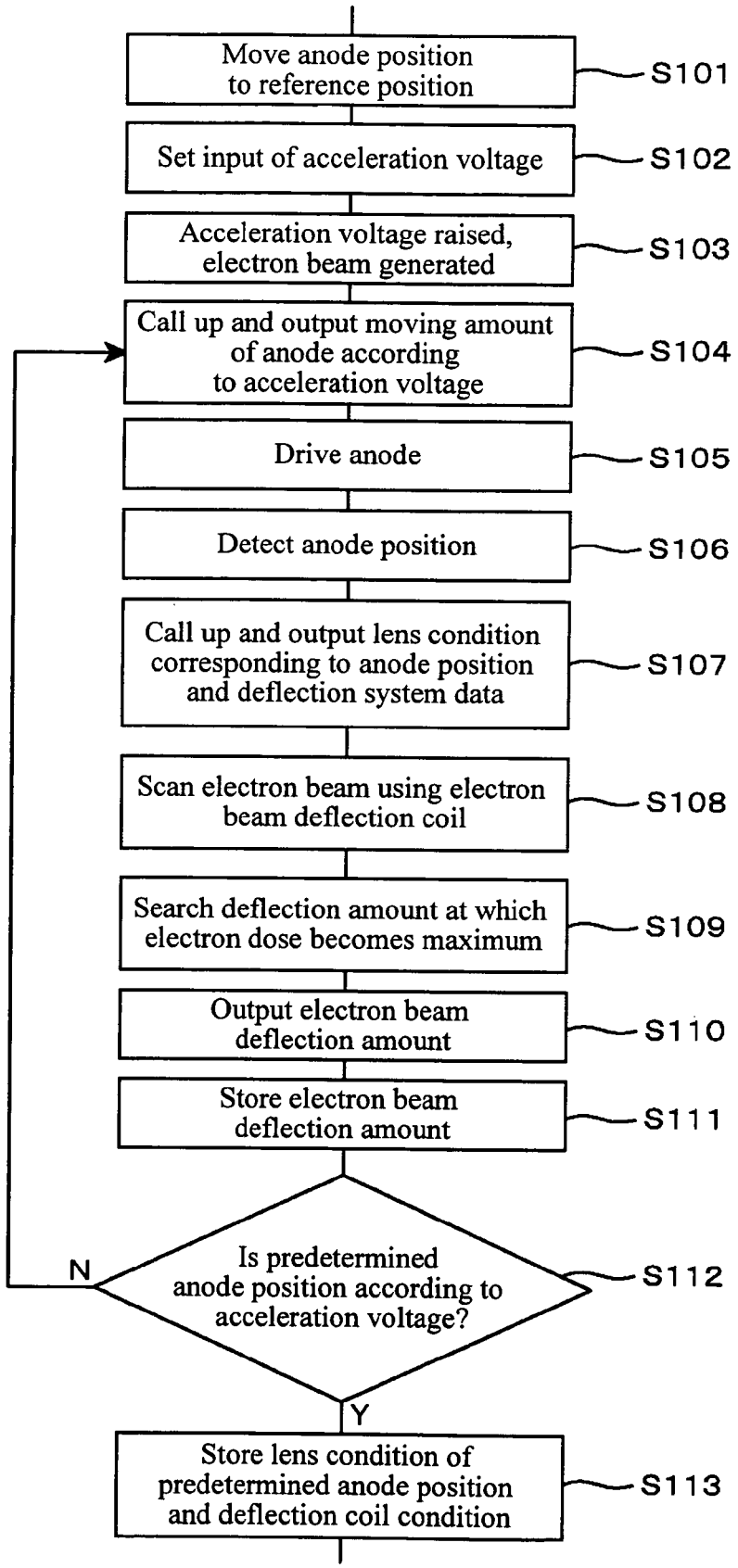
FIG. 4 is a flowchart for explaining a method of automatic adjustment of optical axis misalignment involved in a change of an anode position in the transmission electronic microscope of this embodiment.

At Step 101 in FIG. 4, first, the anode position is set to a reference position using the motor driving described in FIG. 2 or the air driving in FIG. 3. Subsequently, at Step 102, input setting of the acceleration voltage is made. The acceleration voltage input is made using the keyboard 45 or the mouse 46 attached to the PC, processed by the microprocessor 22*b*, and input information is sent to the microprocessor 22*a* through the communication interfaces 24*a*, 24*b* and the information is stored in the storage device 23*b* at the same time.

At Step 103, the microprocessor 22*a* outputs a corresponding value to the DAC 19*b* on the basis of the transmitted acceleration voltage information (including filament pressure and bias voltage), the DAC output signal is amplified by the power source 18*b*, and moreover, the acceleration voltage is generated at the high-voltage generating power source 33. Similarly, the voltage is supplied to the filament power source 31 so as to heat the filament and generate the electron beam. Also, the voltage is supplied to the bias power source 34, the bias voltage is applied to the Wehnelt 2, and the generated electron dose is controlled.

At Step 104, the microprocessor 22*b* calls up the anode moving amount according to the acceleration voltage set at Step 102 and supplies a signal according to the moving amount to the variable mechanism power source 37 through the interface 21*b*. The anode moving amount is a value determined from a predetermined anode position according to the acceleration voltage and is stored in the storage device 23*b* in advance together with the predetermined position.

At Step 105, the anode movable mechanism 36 is driven to the outputted moving position and the anode position is varied. The varying of the anode can be made by the driving method by a motor shown in FIG. 2 and the driving method by air shown in FIG. 3.

At Step 106, using the sensor 35, the anode position varied at Step 105 is detected. The anode position detected by the sensor 35 is converted to a digital signal through the interface 21*a*, and the position information is read in by the microprocessor 22*b* and stored in the storage device 23*b*.

At Step 107, the microprocessor 22*b* calls up the data of the electron beam deflector adjusted for each anode position stored in the storage device 23*b* in advance at the anode position detected at Step 106 and outputs each lens data of the applicable irradiation lens coils 6*a* to 6*c*, the objective lens coil 11, the image forming lens coils 14*a*, 14*b* and the electron beam deflection coil data of the electron gun axis adjustment deflection coils 4, 5, the irradiation system lens astigmatism correction coil 7, the irradiation system axis adjustment deflection coil 9, and the objective lens astigmatism correction coil 12 to the DACs 19*d* to 19*l* to be outputted to the lens and the deflection coil.

The data does not have to be data of the deflector corresponding to each anode position but it may be the acceleration voltage, a generated electron dose directly from the filament or electric field. The lens data relates to a deflection condition of the deflector and may be data also used in a regular operation.

At Step 108, using the electron beam deflector located between the filament and the sample, the electron beam is scanned.

At Step 109, using the fluorescent plate 15 and the photoelectric conversion element 16 for image pickup that can detect the electron dose, the electron dose scanned at Step 108 is detected. The detection signal is amplified by the amplifiers 48*a*, 48*b* and then, converted from an analog signal to a digital signal by the ADCs 20*a*, 20*b* and the value of the detected electron dose is stored in the storage device 23*b*. The microprocessor 22*b* derives the electron beam deflection amount at which the detected electron dose becomes the maximum. A method of searching the electron beam deflection amount at which the electron dose becomes the maximum will be described later. As an alternative to the above-mentioned method of detecting the electron dose, a search can be also made by using a total of image intensities picked up by the CCD camera 17.

At Step 110, the electron beam deflection amount is set at the amount at which the electron dose becomes the maximum and it is outputted.

At Step 111, the electron beam deflection amount at which the electron dose becomes the maximum is stored in the storage device 23*b*.

Here, the deflection amount at which the electron dose becomes the maximum is used, but those other than the above may be target values depending on the case as long as it is a desired electron dose. For example, an electron dose larger than a predetermined value and with a smaller deflection amount may be used.

At Step 112, the microprocessor 22*b* calls up the predetermined anode position according to the anode position detected at Step 106 and the acceleration voltage from the storage device 23*b* and determines if they match each other or not. If not, the routine returns to Step 104, where the anode is moved and the electron beam deflection is controlled so that the detected electron dose becomes the maximum all the time till the predetermined anode position is reached. If matched, the routine goes to Step 113. The lens condition and the deflection condition at the predetermined anode position are stored in the storage device 23*b*.

Also, after the automatic adjustment of the optical axis misalignment, the output of the electron deflector is varied by the input section 29 for electron beam deflection and can be adjusted manually. Finer control becomes possible by a mode in which the automatic control and the manual adjustment are both provided.

By means of the above operations, the anode position is varied by a moving amount set in advance according to the acceleration voltage and by scanning the electron beam using the electron beam deflector, the electron beam deflection amount at which the electron dose becomes the maximum is searched, and by repeating the movement of the anode and the control of the electron beam deflection till the predetermined anode position is reached, the misalignment of the optical axis involved in the positional change of the anode can be eliminated.

For example, an input section which sets the electron dose emitted from the filament is provided and set. And corresponding to the set electron dose, the anode position and the voltage to be applied to the Wehnelt or the voltage to be applied to the charged particle beam source or the both may be controlled.

Alternatively, a section for detecting the electron dose emitted from the filament is provided, and the anode position is changed according to the detected electron dose so that the emitted electron dose can be controlled.

The method of searching the electron beam deflection amount at which the electron dose becomes the maximum at Step 109 in FIG. 4 will be described in detail below. FIG. 5 will be described as a first example.

When the electron beam is scanned as in FIG. 5(*a*), the electric current of the electron beam deflection coil in the X direction is changed as in FIG. 5(*b*), while the electric current of the electron beam deflection coil in the Y direction is also changed as in FIG. 5(*c*).

FIG. 5(*d*) is a schematic diagram of an electron beam intensity change detected by the fluorescent plate 15 or the photoelectric conversion element 16 for image pickup when the electron beam is scanned as in FIG. 5(*a*). Suppose that the electron beam deflection coil current values currently outputted are X0, Y0. The electron beam is scanned based on (X0, Y0), and the deflection coil current value X1 in the X direction and the deflection coil current value Y1 in the Y direction at a time (t) when the detected electron beam intensity becomes the maximum are derived, and (X1, Y1) is stored in the storage device 23*b*.

A second example will be described using FIG. 6.

As in FIG. 6(*a*), when the electron beam is scanned from the center toward the outside, the electric current of the electron beam deflection coil in the X direction is changed as in FIG. 6(*b*), while the electric current of the electron beam deflection coil in the Y direction is similarly changed as in FIG. 6(*c*).

FIG. 6(*d*) is a schematic diagram of the electron beam intensity change detected by the fluorescent plate 15 or the photoelectric conversion element 16 for image pickup when the election beam is scanned as in FIG. 5(*a*). Suppose that the electron beam deflection coil current values currently outputted are X0, Y0. The electron beam is scanned based on (X0, Y0), and the deflection coil current value X1 in the X direction and the deflection coil current value Y1 in the Y direction at a time (t) when the detected electron beam intensity becomes the maximum are derived, and (X1, Y1) is stored in the storage device 23*b*.

In the search of scanning the electron beam as above, such a configuration can be easily thought of that a search speed is improved by providing a section for variably setting a scanning range.

The deflection amount can be controlled to be outputted to the electron beam deflector by providing a section which calls up and outputs a value (data) of the electron beam deflector corresponding to each varied anode position or a section which detects the electron beam and a section which scans the electron beam and by deriving the electron beam deflection amount at which the electron dose detected by the scanning section becomes the maximum in conjunction with the anode positional change.

This embodiment relates to a charged particle beam device and particularly to an electronic microscope capable of observation with a sufficient electron dose (brightness) required for image observation even at a low-acceleration voltage and of automatic adjustment of optical axis misalignment involved in varying of the anode position in an electronic microscope.

What is claimed is:

1. A charged particle beam device comprising:
    a cathode provided with a charged particle beam source which emits a charged particle beam and an anode which applies an electric field to the emitted charged particle; and
    a charged particle beam deflector which deflects an orbit of the charged particle beam having passed the anode and a charged particle beam detector which detects the charged particle beam from a sample to which the charged particle is irradiated;
    a distance changing mechanism in which a distance between said cathode and said anode is changed corresponding to the charged particle amount emitted from said charged particle source; and
    a deflection amount control mechanism which detects a condition of said deflector under which the charged particle beam amount detected from said sample scanned by deflecting the charged particle beam in said changed distance becomes a desired size and controls deflection of said deflector at sample measurement on the basis of said condition, wherein:
    said distance changing mechanism is provided with an anode position changing mechanism which changes an anode position and has a storage portion which stores condition data of the charged particle beam deflector corresponding to the anode position, a read-out portion which calls up the stored data from said storage portion, and an output portion which outputs the called-up data to the charged particle beam deflector, and
    said deflection amount control mechanism detects said condition by changing an output of the electron beam deflector on the basis of said called-up data and stores said detected condition in the storage portion.

2. The charged particle beam device according to claim 1, wherein:
    said anode position changing mechanism has an input portion which moves the anode position to an arbitrary position, and
    the anode position is configured to be movable according to a signal from the input portion.

3. The charged particle beam device according to claim 1, wherein:
    an input portion for setting a voltage to be applied to said cathode is provided, and
    said anode position is changed corresponding to a size of said set voltage.

4. The charged particle beam device according to claim 1, further comprising:
    a Wehnelt installed between said charged particle source and said anode and an input portion which sets a charged particle dose emitted from the charged particle beam source,
    wherein said anode position and a voltage to be applied to said Wehnelt, a voltage to be applied to said charged particle beam source or said both voltages are controlled corresponding to said set charged particle dose.

5. The charged particle beam device according to claim 1, wherein a detection portion which detects a charged particle dose emitted from said charged particle beam source is provided so that the emitted electron dose can be controlled by changing an anode position according to the detected charged particle dose.

6. The charged particle beam device according to claim 1, further comprising:

an image forming portion which forms a charged particle beam image on the basis of detection information from the charged particle beam detector, wherein an emitted charged particle dose can be controlled by changing an anode position according to a picked-up image intensity.

7. The charged particle beam device according to claim 1, wherein said charged particle beam is an electron beam.

* * * * *